United States Patent [19]

Sundstrom

[11] Patent Number: 4,998,029
[45] Date of Patent: Mar. 5, 1991

[54] DUAL SUPPLY ECL TO TTL TRANSLATOR

[75] Inventor: Ray D. Sundstrom, Chandler, Ariz.

[73] Assignee: Motorola, Inc., Schaumburg, Ill.

[21] Appl. No.: 374,722

[22] Filed: Jul. 3, 1989

[51] Int. Cl.[5] .................. H03K 19/086; H03B 1/04
[52] U.S. Cl. ............................. 307/475; 307/455;
307/456; 307/542; 307/546
[58] Field of Search .................. 307/443, 455–456,
307/475, 542, 546

[56] References Cited

FOREIGN PATENT DOCUMENTS 0036230 4/1981 Japan .................................. 307/475

OTHER PUBLICATIONS

IBM Tech. Dis. Bul., "ECL to TTL Translator Driven", Froment et al., vol. 21, No. 10, 3/79.
IBM Tech. Disc. Bul., "Totem-Pole Driven for High--Capacitance Loads", Colao et al., vol. 18, No. 11, 4/76.

Primary Examiner—Stanley D. Miller
Assistant Examiner—Margaret Rose Wambach
Attorney, Agent, or Firm—Mike Bingham; Robert Atkins

[57] ABSTRACT

An ECL to TTL translator converts a signal from ECL logic levels to TTL compatible logic levels without introducing current spikes in the output signal during logic translations. The ECL input signal is transformed into first and second differentially related currents which develop first and second voltages for biasing first and second switching circuits which in turn generate first and second complementary control signals. The sum total of the differentially related currents are limited to a predetermined magnitude blocking simultaneously assertion of the control signals. An output stage includes an upper and lower transistors each responsive to the first and second control signal respectively for developing a TTL high and TTL low output signal. The first and second switching circuits inhibit simultaneous conduction of the upper and lower transistors of the output stage preventing undesirable current spikes in the output signal thereof.

23 Claims, 1 Drawing Sheet

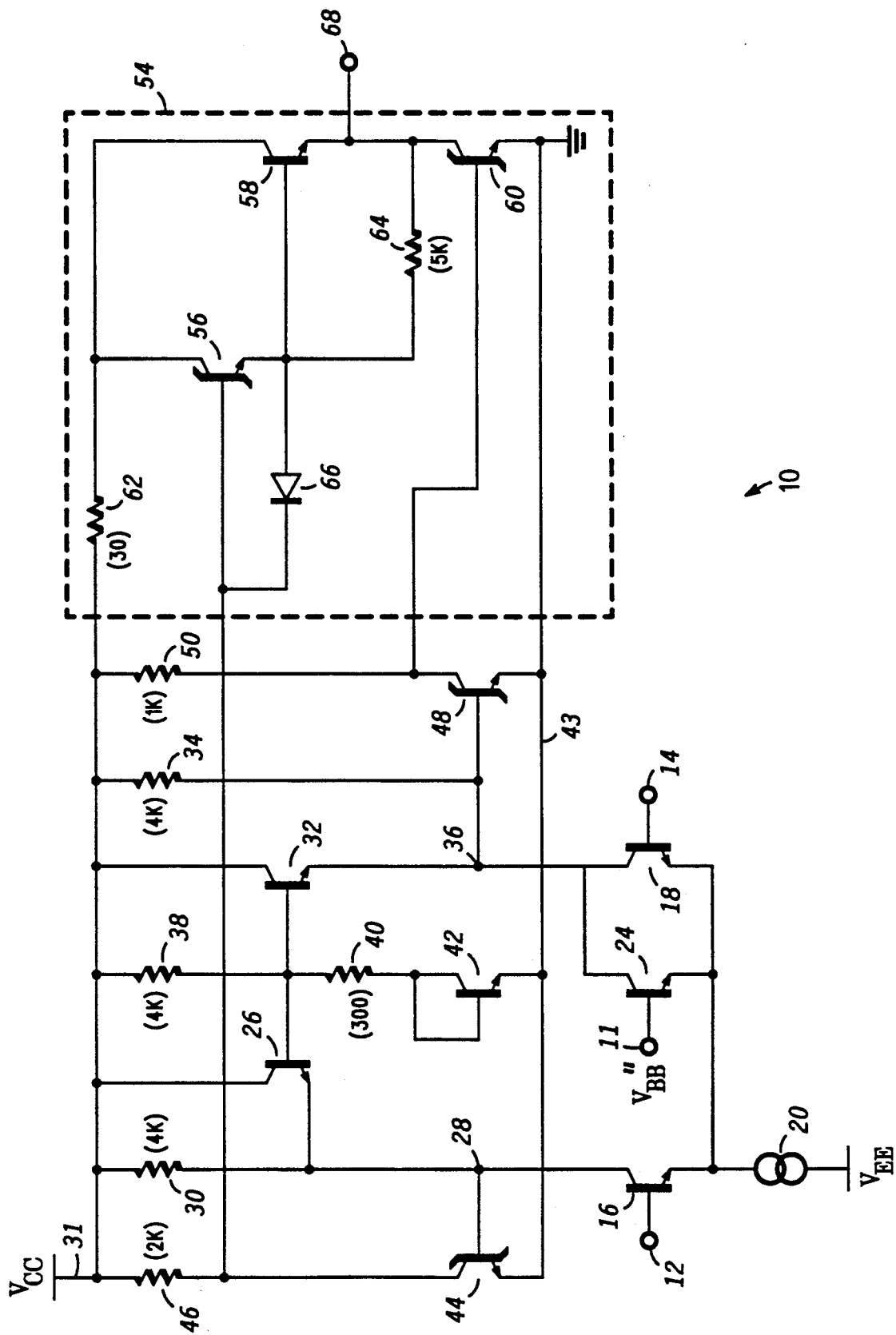

4,998,029

DUAL SUPPLY ECL TO TTL TRANSLATOR

BACKGROUND ON THE INVENTION

The present invention relates to voltage translators, and more particularly, to an ECL to TTL translator which eliminates current spikes in the output thereof.

As is well known, many of today's complex systems mix and match integrated circuits (ICs) of different logic families to accomplish a series of interrelated functions. In one example, signals produced in a one logic family, ECL, are translated to levels compatible with another logic family, TTL, for further processing. A typical ECL to TTL translator converts a differential ECL input signal to first and second complementary control voltages for driving upper and lower transistors of an output stage respectively. The collector-emitter conduction paths of the upper and lower transistors are serially coupled between a positive supply voltage, $V_{CC}$, and ground potential. The complementary control voltages are generated in independent conduction paths coupled between power supplies, $V_{CC}$ and $V_{EE}$, typically operating at 5 volts and −5.2 volts respectively. The currents flowing therethrough are made large, typically 7 milliamps (ma) or greater, for rapid switching of the control voltages, but not without the cost of considerable power consumption.

During logic transitions, as the differential ECL input signal passes through zero, the upper and lower transistors of the output stage are simultaneously enabled allowing undesirably large currents to flow therebetween. These current spikes induce noise into the power supplies causing a myriad of problems in adjacent circuits including false logic switching. The greater the frequency of operation, the greater the noise problem. Furthermore, the inherent base discharge time of the output stage transistors may permit one transistor to turn on before the other one turns off again enabling simultaneous conduction and current spikes.

Hence, there is a need for an improved ECL to TTL translator which eliminates current spikes in the output signal during logic transitions. The improved ECL to TTL translator should be operative with reduced quiescent currents and consume less power.

SUMMARY OF THE INVENTION

It is therefore the subject of the present invention to provide an improved voltage translator.

A further objective of the present invention is to provide an improved voltage translator operating free of current spikes in the output signal thereof.

Another objective of the present invention is to provide an improved voltage translator for receiving ECL signals and level shifting to TTL logic signals.

Still another objective of the present invention is to provide an improved ECL to TTL translator operative with reduced quiescent currents and consuming less power as compared to conventional translators.

In accordance with the above and other objectives there is provided an improved ECL to TTL translator including an input stage for receiving an ECL input signal and providing first and second differentially related currents in response thereto; a current supply coupled to the input stage for limiting the sum total of the first and second differentially related currents to a predetermined magnitude; a clamping circuit coupled to the first and second outputs of the input stage for limiting the first and second voltages developed thereat; first and second switching circuits coupled to the first and second outputs of the input stage respectively and responsive to the first and second voltages developed thereat for providing a first and second control signals; and an output stage responsive to the first and second control signals respectively for providing first and second output signal levels wherein the limitation imposed upon the first and second differentially related currents inhibits simultaneous assertion of the first and second control signals.

BRIEF DESCRIPTION OF THE DRAWINGS

The single figure is a schematic diagram illustrating the preferred embodiment of the present invention.

DESCRIPTION OF THE PREFERRED EMBODIMENT

Referring to the sole FIGURE, translator 10 includes inputs 12 and 14 coupled to the bases of differentially connected transistors 16 and 18 which are responsive to a differential ECL signal applied thereto. Current supply 20 is coupled between the emitters of transistors 16 and 18 and a source of negative operating potential, $V_{EE}$, wherein the sum total of the currents flowing in transistors 16 and 18 is limited to the magnitude of the current flowing through current supply 20. A bias potential, $V_{BB}''$, typically −2.8 volts, is applied to the base of transistor 24. The collectors and emitters of transistors 18 and 24 are coupled together, as shown, for providing a fail-safe mechanism to clamp the emitters one base-emitter junction potential ($V_{be}$) below $V_{BB}''$ should inputs 12 and 14 inadvertently be open circuited or disabled.

The collector-emitter path of transistor 26 and resistor 30 are coupled in parallel between power supply conductor 31, $V_{CC}$, typically operating at 5 volts, and the collector of transistor 16 at node 28. In a like manner, the collector-emitter path of transistor 32 as well as resistor 34 are coupled between power supply conductor 31, and the collector of transistor 18 at node 36. Resistors 38 and 40 and the collector-emitter path of transistor 42 are serially coupled between power supply conductors 31 and 43 the latter operating at ground potential. The base and collector of transistor 42 are coupled together to function as a diode providing a temperature compensated potential of one $V_{be}$ above ground potential at the connecting terminal of resistor 40. A reference potential, typically 1.1 volts, is developed at the interconnection of resistors 38 and 40 and is applied to the bases of transistors 26 and 32. The collector-emitter path of transistor 44 and resistor 46 are serially coupled between power supply conductors 31 and 43. The collector-emitter path of transistor 48 and resistor 50 are similarly coupled. Thus, the circuit combination of transistors 26 and 44 and resistors 30 and 46 is the mirror image of the combination of transistors 32 and 48 and resistors 34 and 50 each performing a current-to-voltage conversion for providing first and second complementary control voltages at the collectors of transistors 44 and 48 respectively.

Transistors 16 and 18 each conduct DC current, I, and differential currents $\pm\Delta I$ in response to the differential ECL input signal. Assuming that the differential ECL signal is applied such that the voltage at input 12 is more positive than the voltage at input 14, transistor 16 conducts DC current, I, and differential current $+\Delta I$ the latter component reducing the voltage at node 28 turning off transistor 44 and establishing a first control voltage substantially equal to $V_{CC}$ at the collector thereof. As the voltage at node 28 falls to the cutin potential (minimum $V_{be}$ to enable conduction) of transistor 26, the voltage at its emitter is clamped to one $V_{be}$ below the reference potential, usually about 0.4 volts. On the other side, transistor 18 conducts current, I-$\Delta$I, through resistor 34 allowing the voltage at node 36 to rise turning on transistor 48 and turning off transistor 32 and reducing the second control voltage to the saturation potential of the same. The upper limit of the voltage at node 36 is equal to the $V_{be}$ of transistor 48. It is the differential currents, $\pm\Delta$I, which bias and unbias transistors 44 and 48 to switch the first and second control voltages.

Output stage 54 is a typical TTL output driver circuit including Darlington transistor pair 56 and 58 and transistor 60. The collectors of transistors 56 and 58 are coupled together through current limiting resistor 62 to power supply conductor 31. As standard practice in a TTL output stage, resistor 64 and diode 66 are serially coupled between the base of transistor 56 and the emitter of transistor 58 as shown. The emitter of transistor 56 and the base of transistor 58 are also coupled together to the interconnection of resistor 64 and diode 66 at the anode thereof. The collector-emitter conduction path of transistor 60 is coupled between output 68 at the emitter of transistor 58 and power supply conductor 43. Hence, the first control voltage turns on transistor 56 biasing transistor 58 and providing a TTL high signal at output 68. The complementary second control voltage turns transistor 60 off isolating output 68 from ground potential.

Reversing the ECL input signal, transistor 16 conducts current, I-$\Delta$I, through resistor 30 allowing the voltage at node 28 to rise to the cutin potential of transistor 44 turning off transistor 26 and reducing the first control voltage to the saturation potential of transistor 44. The first control voltage then turns off transistors 56 and 58 releasing output 68. Correspondingly, transistor 18 conducts current, I+$\Delta$I, reducing the voltage at node 36 turning off transistor 48 and establishing a second control voltage equal to the $V_{be}$ of transistor 60. As the voltage at node 36 falls to the cutin potential of transistor 32, the voltage at its emitter is clamped to one $V_{be}$ below the reference potential. The second control voltage then turns on transistor 60 pulling output 68 to a saturation potential establishing a TTL low output signal.

One principal attribute of translator 10 preventing the aforedescribed current spikes involves the active pull down feature of transistors 44 and 48 to switch the first and second control voltages. The current flowing in current supply 20 is set to a small value, typically 2 ma, so that during the zero cross-over of the ECL signal neither transistor 16 nor 18 may sink sufficient current to reduce the voltages at nodes 28 and 36 to unbias transistors 44 or 48. Thus, transistors 44 and 48 are both maintained in conduction and the first and second control voltages remain low disabling transistor 60 and Darlington pair 56 and 58 preventing the undesirable current spikes.

Equally important, during one logic transition, the bases of transistors 56 and 58 must be discharged before transistor 60 turns on, and for the opposing logic transition, the base of transistor 60 must discharge before transistors 56 and 58 turn on. Consequently, Schottky transistors, well known for improved performance over conventional bipolar transistors when operating in saturation, are typically used for transistors 44, 48, 56 and 60. The bases of transistors 56 and 58 are discharged directly through the collector-emitter conduction path of transistor 44 wherein transistor 58 conducts through diode 66. Likewise, the base of transistor 60 is discharged through the collector-emitter conduction path of transistor 48 into ground potential. Resistors 30 and 34, 38 and 40 must be properly selected to insure sufficient discharge time to turn one transistor off before the other turns on. Resistor 30 limits the base current drive to transistor 44 while resistor 46 limits the collector current flowing therethrough. Thus, the switching time of the first control voltage may be decreased by reducing the value of resistor 30 or increasing the value of resistor 46, or a combination thereof. Resistors 34 and 50 operate in a like manner for transistor 48. Accordingly, typical values for the resistors are shown in parenthesis.

Hence, what has been described has been a novel voltage translator for translating an ECL input signal to TTL compatible levels without introducing current spikes in the output signal thereof. It is understood that this description is made only by way of example and that the present invention may relate equally well to other input and output signals levels.

I claim:

1. A circuit, comprising:

input stage having first and second outputs for developing first and second differential voltages in response to an input signal;

current supply means having an output coupled to said input stage for conducting a predetermined current therethrough;

clamping means coupled to said first and second outputs of said input stage for limiting said first and second differential voltages to predetermined values, said clamping means including, (a) a first transistor having a base, an emitter and a collector, said collector being coupled to a first power supply conductor, said emitter being coupled to said first output of said input stage, (b) a second transistor having a base, an emitter and a collector, said collector being coupled to said first power supply conductor, said emitter being coupled to said second output of said input stage, and (c) a reference circuit for providing a reference potential at said bases of said first and second transistors;

first and second switching means coupled to said first and second outputs of said input stage respectively and responsive to said first and second differential voltages for providing first and second control signals; and output stage responsive to said first and second control signals respectively for providing first and second output signal levels wherein the limitation imposed upon said first and second differentially related currents prohibits simultaneous assertion of said first and second control signals.

2. The circuit of claim 1 wherein said first switching means includes:

a third transistor having a base, an emitter and a collector, said base being coupled to said first output of said input stage, said emitter being coupled to a second power supply conductor;

a first resistor coupled between said collector and said first power supply conductor for developing a first control signal; and a second resistor coupled between said base and said first power supply conductor.

3. The circuit of claim 2 wherein said second switching means includes:

a fourth transistor having a base, an emitter and a collector, said base being coupled to said second output of said input stage, said emitter being coupled to said second power supply conductor;

a third resistor coupled between said collector and said first power supply conductor for developing a second control signal; and a fourth resistor coupled between said base and said first power supply conductor.

4. The circuit of claim 3 wherein said reference circuit includes:

diode means having an anode and a cathode coupled to said second power supply conductor; and fifth and sixth resistors serially coupled between said first power supply conductor and said anode of said diode means, said reference potential being developed at the interconnection of said fifth and sixth resistors.

5. The circuit of claim 4 wherein said diode means includes a fifth transistor having a base, an emitter and a collector, said collector and base being coupled together to said anode of said diode means, said emitter being coupled to said cathode of said diode means.

6. The circuit of claim 5 wherein said input signal is a differential input signal.

7. The circuit of claim 6 wherein said input stage includes:

a sixth transistor having a base, an emitter and a collector, said collector being coupled to said first output of said input stage; and a seventh transistor having a base, an emitter and a collector, said collector being coupled to said second output of said input stage, said bases of said sixth and seventh transistors being responsive to said differential input signal, said emitters of said sixth and seventh transistors being coupled together to said current supply means.

8. The circuit of claim 7 wherein said input stage further includes an eighth transistor having a base, an emitter and a collector, said collectors of said seventh and eighth transistors being coupled together, said emitters of said seventh and eighth transistor being coupled together, said base being responsive to a bias signal for clamping said emitter to a predetermined value.

9. The circuit of claim 8 wherein said output stage includes:

a ninth transistor having an emitter, a collector and a base responsive to said first control signal;

a tenth transistor having a base, an emitter and a collector, said collectors of said ninth and tenth transistors being coupled together, said base of said tenth transistor being coupled to said emitter of said ninth transistor;

an eleventh transistor having a base, an emitter and a collector, said collector of said eleventh transistor being coupled to said emitter of said tenth transistor for providing said output signal, said base being responsive to said second control signal, said emitter being coupled to said second power supply conductor; and a seventh resistor coupled between said collectors of said ninth and tenth transistors and said first power supply conductor.

10. The circuit of claim 9 wherein said output stage further includes:

a diode having an anode coupled to said emitter of said ninth transistor and a cathode coupled to said base of said ninth transistor; and an eighth resistor coupled between said emitters of said ninth and tenth transistors.

11. A voltage translator for receiving a differential input signal and generating therefrom an output signal, comprising:

input stage having first and second outputs for developing first and second differential voltages in response to the differential input signal;

first means for developing a reference potential;

clamping means coupled to said first and second outputs of said input stage and responsive to said reference potential of said first means for limiting said first and second differential voltages to predetermined values with respect to said reference potential;

a first transistor having a base, an emitter and a collector, said base being coupled to said first output of said input stage, said emitter being coupled to a second power supply conductor;

a first resistor coupled between said collector of said first transistor and a first power supply conductor wherein a first control signal is developed at said collector of said first transistor;

a second transistor having a base, an emitter and a collector, said base being coupled to said second output of said input stage, said emitter being coupled to said second power supply conductor;

a second resistor coupled between said collector of said second transistor and said first power supply conductor wherein a second control signal is developed at said collector of said second transistor; and output stage having third and fourth transistors serially coupled between said first and second power supply conductors each responsive to said first and second control signals respectively for generating the output signal wherein said first and second transistors provide rapid base discharge of said third and fourth transistors during transitions of the differential input signal preventing simultaneous conduction thereof.

12. The voltage translator of claim 11 further comprising:

a third resistor coupled between said base of said first transistor and said first power supply conductor for adjusting the base discharge rate of said third transistor; and a fourth resistor coupled between said base of said second transistor and said first power supply conductor for adjusting the base discharge rate of said fourth transistor.

13. The voltage translator of claim 12 wherein said clamping means includes:

a fifth transistor having a base, an emitter and a collector, said collector being coupled to said first power supply conductor, said emitter being coupled to said first output of said input stage, said base being coupled for receiving said reference potential of said first means; and a sixth transistor having a base, an emitter and a collector, said collector being coupled to said first power supply conductor, said emitter being coupled to said second output of said input stage, said base being coupled for receiving said reference potential of said first means.

14. The voltage translator of claim 13 wherein said first means includes:
   a diode having an anode and a cathode coupled to said second power supply conductor; and
   fifth and sixth resistors serially coupled between said first power supply conductor and said anode of said diode, said reference potential being developed at the interconnection of said fifth and sixth resistors.

15. The voltage translator of claim 14 wherein said input stage includes:
   current supply means for providing a current of predetermined magnitude;
   a seventh transistor having a base, an emitter and a collector, said collector being coupled to said first output of said input stage; and
   an eighth transistor having a base, an emitter and a collector, said collector being coupled to said second output of said input stage, said bases of said seventh and eighth transistors being responsive to the differential input signal, said emitters of said seventh and eighth transistors being coupled together to said current supply means.

16. The voltage translator of claim 15 wherein said input stage further includes a ninth transistor having a base, an emitter and a collector, said collectors of said eighth and ninth transistors being coupled together, said emitter of said eighth and ninth transistors being coupled together, said base being responsive to a bias signal for clamping the emitter thereof to a predetermined value.

17. The voltage translator of claim 16 wherein said output stage includes:
   a tenth transistor having a base, an emitter and a collector, said collectors of said third and tenth transistors being coupled together, said base of said third transistor being coupled to said emitter of said tenth transistor; and
   a seventh resistor coupled between said collectors of said third and tenth transistors and said first power supply conductor.

18. The voltage translator of claim 17 wherein said output stage further includes:
   a diode having an anode coupled to said base of said third transistor and a cathode coupled to said base of said tenth transistor; and
   an eighth resistor coupled between said emitters of said third and tenth transistors.

19. A voltage translator for a differential input signal and generating therefrom an output signal, comprising:
   input stage having first and second outputs for developing first and second differential voltages in response to an input signal;
   current supply means having an output coupled to said input stage for conducting a predetermined current therethrough;
   first means for developing a reference potential;
   clamping means coupled to said first and second outputs of said input stage and responsive to said reference potential of said first means for limiting said first and second differential voltages to predetermined values with respect to said reference potential;
   first and second switching means coupled to said first and second outputs of said input stage respectively and responsive to said first and second differential voltages for providing first and second control signals; and
   output stage responsive to said first and second control signals respectively for providing first and second output signal levels wherein the limitation imposed upon said first and second differentially related currents prohibits simultaneous assertion of said first and second control signals.

20. The voltage translator of claim 19 wherein said first switching means includes:
   a first transistor having a base, an emitter and a collector, said base being coupled to said first output of said input stage, said emitter being coupled to a second power supply conductor;
   a first resistor coupled between said collector and a first power supply conductor for developing a first control signal; and
   a second resistor coupled between said base and said first power supply conductor.

21. The voltage translator of claim 20 wherein said second switching means includes:
   a second transistor having a base, an emitter and a collector, said base being coupled to said second output of said input stage, said emitter being coupled to said second power supply conductor;
   a third resistor coupled between said collector and said first power supply conductor for developing a second control signal; and
   a fourth resistor coupled between said base and said first power supply conductor.

22. The voltage translator of claim 21 wherein said clamping means includes:
   a third transistor having a base, an emitter and a collector, said collector being coupled to said first power supply conductor, said emitter being coupled to said first output of said input stage, said base being coupled for receiving said reference potential of said first means; and
   a fourth transistor having a base, an emitter and a collector, said collector being coupled to said first power supply conductor, said emitter being coupled to said second output of said input stage, said base being coupled for receiving said reference potential of said first means.

23. The voltage translator of claim 22 wherein said first means includes:
   diode means having an anode and a cathode coupled to said second power supply conductor; and
   fifth and sixth resistors serially coupled between said first power supply conductor and said anode of said diode means, said reference potential being developed at the interconnection of said fifth and sixth resistors.

* * * * *